(12) United States Patent
Li

(10) Patent No.: US 7,740,705 B2
(45) Date of Patent: *Jun. 22, 2010

(54) EXHAUST APPARATUS CONFIGURED TO REDUCE PARTICLE CONTAMINATION IN A DEPOSITION SYSTEM

(75) Inventor: Yicheng Li, Kai (JP)

(73) Assignee: Tokyo Electron Limited, Tokyo (JP)

( * ) Notice: Subject to any disclaimer, the term of this patent is extended or adjusted under 35 U.S.C. 154(b) by 1140 days.

This patent is subject to a terminal disclaimer.

(21) Appl. No.: 11/369,883

(22) Filed: Mar. 8, 2006

(65) Prior Publication Data

US 2007/0212484 A1 Sep. 13, 2007

(51) Int. Cl.
*C23C 16/505* (2006.01)
*H01L 21/363* (2006.01)

(52) U.S. Cl. ............... 118/715; 118/723 E; 118/723 R; 118/733; 156/345.29

(58) Field of Classification Search ................. 118/715, 118/723 E, 723 R, 733; 156/345.29
See application file for complete search history.

(56) References Cited

U.S. PATENT DOCUMENTS

| 4,778,559 | A | * | 10/1988 | McNeilly | 118/728 |
| 4,870,923 | A | * | 10/1989 | Sugimoto | 118/715 |
| 5,223,001 | A | * | 6/1993 | Saeki | 29/25.01 |
| 6,051,371 | A | * | 4/2000 | Mita et al. | 430/330 |
| 6,183,564 | B1 | * | 2/2001 | Reynolds et al. | 118/719 |
| 6,281,141 | B1 | * | 8/2001 | Das et al. | 438/770 |

* cited by examiner

*Primary Examiner*—Parviz Hassanzadeh
*Assistant Examiner*—Satish Chandra
(74) *Attorney, Agent, or Firm*—Oblon, Spivak, McClelland, Maier & Neustadt, L.L.P.

(57) ABSTRACT

A method and system for vapor deposition on a substrate that disposes a substrate in a process space of a processing system that is isolated from a transfer space of the processing system, processes the substrate at either of a first position or a second position in the process space while maintaining isolation from the transfer space, and deposits a material on said substrate at either the first position or the second position. Furthermore, the system includes a high conductance exhaust apparatus configured to be coupled to the process space, whereby particle contamination of the substrate processed in the deposition system is minimized. The exhaust apparatus comprises a pumping system located above the substrate and an evacuation duct, wherein the evacuation duct has an inlet located below the substrate plane.

11 Claims, 12 Drawing Sheets

EXHAUST APPARATUS CONFIGURED TO REDUCE PARTICLE CONTAMINATION IN A DEPOSITION SYSTEM

CROSS REFERENCE TO RELATED APPLICATIONS

This application is related to U.S. Ser. No. 11/090,255, Client Ref. No. TTCA 19, U.S. Pat. Appl. Publ. No. 20060213437, the entire contents of which are incorporated herein by reference. This application is related to U.S. Ser. No. 11/084,176, Client Ref. No. TTCA 24, U.S. Pat. Appl. Publ. No. 20060211243, the entire contents of which are incorporated herein by reference. This application is related to U.S. Ser. No. 11/090,939, Client Ref. No. TTCA 27, U.S. Pat. Appl. Publ. No. 20060213439, the entire contents of which are incorporated herein by reference. This application is related to U.S. Ser. No. 11/281,343, Client Ref. No. TTCA 54, U.S. Pat. Appl. Publ. No. 20070116888, the entire contents of which are incorporated herein by reference. This application is related to U.S. Ser. No. 11/281,342, Client Ref. No. TTCA 55, U.S. Pat. Appl. Publ. No. 20070116887, the entire contents of which are incorporated herein by reference. This application is related to U.S. Ser. No. 11/305,036, Client Ref. No. TTCA 63, U.S. Pat. Appl. Publ. No. 20070157683, the entire contents of which are incorporated herein by reference.

BACKGROUND OF THE INVENTION

1. Field of Invention

The present invention relates to a deposition system and a method of operating thereof, and more particularly to a deposition system having separate regions for material deposition and transfer.

2. Description of Related Art

Typically, during materials processing, when fabricating composite material structures, a plasma is frequently employed to facilitate the addition and removal of material films. For example, in semiconductor processing, a dry plasma etch process is often utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, a plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), and plasma enhanced ALD (PEALD) have emerged as candidates for ultra-thin gate film formation in front end-of-line (FEOL) operations, as well as ultra-thin barrier layer and seed layer formation for metallization in back end-of-line (BEOL) operations. In ALD, two or more process gases, such as a film precursor and a reduction gas, are introduced alternatingly and sequentially while the substrate is heated in order to form a material film one monolayer at a time. In PEALD, plasma is formed during the introduction of the reduction gas to form a reduction plasma. To date, ALD and PEALD processes have proven to provide improved uniformity in layer thickness and conformality to features on which the layer is deposited, albeit these processes are slower than their CVD and PECVD counterparts.

In any vacuum deposition process, contamination is a concern. The walls of a process space may hold remnants of previous processes which are unwanted during a subsequent deposition process. Thus, the smaller the process space, the lower the amount, in general, of contaminants adhered to the walls of the process space. Further, the smaller the process space, the less time required to evacuate and add process gas to the process space. However, small process spaces are generally more difficult to plumb due to space constraints.

Contamination can be reduced by aggressively evacuating the process chamber, but care must be taken not to negatively affect the deposition process.

SUMMARY OF THE INVENTION

One aspect of the present invention is directed to addressing various problems with semiconductor processing at ever decreasing line sizes where conformality, adhesion, and purity are becoming increasingly important issues affecting the resultant semiconductor device.

Another aspect of the present invention is to reduce contamination problems between interfaces of subsequently deposited or processed layers while maintaining process uniformity.

Another aspect of the present invention is to overcome the difficulties in plumbing a small process chamber while maintaining the ability to evacuate the chamber to reduce contamination.

Another aspect of the present invention is to provide a configuration compatible for vapor deposition and sample transfer within the same system.

Variations of these and/or other aspects of the present invention are provided by certain embodiments of the present invention.

One non-limiting embodiment includes a deposition system configured to form a deposit on a substrate, comprising, a chamber assembly configured to facilitate material deposition and to facilitate transfer of said substrate into and out of said deposition system, a substrate stage coupled to said chamber assembly and configured to support said substrate proximate a process space in said chamber assembly, a vacuum pump in fluid communication with said chamber assembly and located above said substrate, and a pumping manifold in fluid communication with an inlet of said vacuum pump and including at least one opening located below a level of said substrate.

Yet another embodiment includes a method of material deposition on a substrate in a vapor deposition system having a process space separated from a transfer space, comprising: disposing said substrate in the process space that is vacuum isolated from the transfer space, pumping said process space from at least one opening below a level of said substrate using a vacuum pump located above said substrate, processing said substrate at either of a first position or a second position in the process space while maintaining vacuum isolation from the transfer space, and depositing a material on said substrate at either the first position or the second position.

Another non-limiting embodiment of the present invention includes a deposition system configured to form a deposit on a substrate, including: a chamber assembly configured to facilitate material deposition and to facilitate transfer of said substrate into and out of said deposition system, a substrate stage coupled to said chamber assembly and configured to support said substrate proximate a process space in said chamber assembly, a vacuum pump in fluid communication with said chamber assembly and located above said substrate, and means for conducting gas from a level below a level of said substrate to said vacuum pump equally from more than one location in the process space.

BRIEF DESCRIPTION OF THE DRAWINGS

In the accompanying drawings, a more complete appreciation of the present invention and many attendant advantages thereof will be readily obtained as the same becomes better understood by reference to the following detailed description when considered in connection with the accompanying drawings, wherein.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1A:
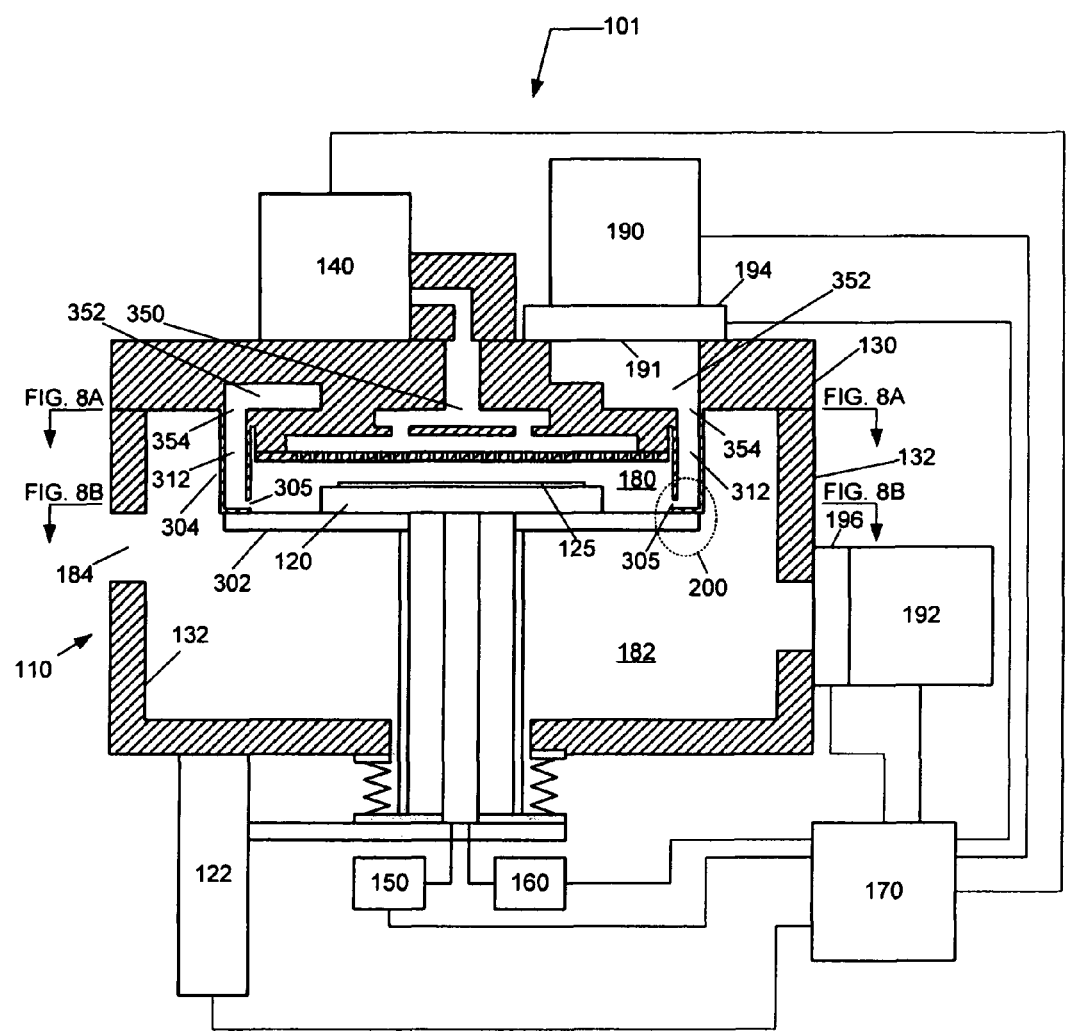
FIG. 1 depicts a schematic view of a deposition system in accordance with one embodiment of the present invention.

Referring now to the drawings, wherein like reference numerals designate identical or corresponding parts throughout the several views, FIG. 1A illustrates a deposition system 1 for depositing a thin film, such as a barrier film, on a substrate using for example a chemical vapor deposition (CVD) process, a plasma enhanced CVD (PECVD) process, an atomic layer deposition (ALD) process, or a plasma enhanced atomic layer deposition (PEALD) process. During the metallization of inter-connect and intra-connect structures for semiconductor devices in back-end-of-line (BEOL) operations, a thin conformal barrier layer may be deposited on wiring trenches or vias to minimize the migration of metal into the inter-level or intra-level dielectric, a thin conformal seed layer may be deposited on wiring trenches or vias to provide a film with acceptable adhesion properties for bulk metal fill, and/or a thin conformal adhesion layer may be deposited on wiring trenches or vias to provide a film with acceptable adhesion properties for metal seed deposition. In addition to these processes, a bulk metal such as copper must be deposited within the wiring trench or via.

As line sizes shrink, PEALD has emerged as a leading candidate for such thin films. For example, deposition of a thin barrier layer is preferably performed using a self-limiting ALD process, such as PEALD, since it provides acceptable conformality to complex, high aspect ratio features. In order to achieve a self-limiting deposition characteristic, a PEALD process involves alternating different process gases, such as a film precursor and a reduction gas, whereby the film precursor is adsorbed to the substrate surface in a first step and then reduced to form the desired film in a second step. Due to the alternation of two process gases in a vacuum chamber, deposition occurs at a relatively slow deposition rate.

The present inventors have recognized that a PEALD process can benefit by separating the process space within which the PEALD process is performed from a transfer space within which the substrate is transferred into and out of the processing chamber. The physical isolation of the process space and the transfer space reduces the contamination of processed substrates. Since CVD and ALD processes are know to be "dirtier" than other deposition techniques, such as physical vapor deposition (PVD), the physical isolation of the process space and the transfer space can further reduce the transport of contamination from the processing chamber to other processing chambers coupled to the central transfer system.

Thus, it is described in related applications Ser. No. 11/090,939 (TTCA-027), Ser. No. 11/281,376 (TTCA-056), and Ser. No. 11/281,372 (TTCA-069) to separate a process space from a transfer space in order to reduce contamination of processed substrates; the entire contents of each of which are herein incorporated by reference in their entirety.

When physically separating the process space from the transfer space, a first vacuum pumping system and a second vacuum pumping system are used to separately pump the process space and the transfer space, respectively.

Further, the materials used for the CVD and ALD processes are increasingly more complex. For example, when depositing metal containing films, metal halide film precursors or metal-organic film precursors are utilized. As such, the processing chambers are often contaminated with precursor residue or partially decomposed precursor residue or both on walls of the deposition system.

One way to reduce film precursor residue on chamber surfaces is to increase a temperature of the surfaces in the processing chambers to a point where precursor accumulation cannot occur. However, the present inventors have recognized that such a high temperature chamber (especially when used with elastomer seals) can cause air and water vapor from outside of the (vacuum) processing chamber, and therefore contaminants, to permeate through the seals of the processing chamber. For example, while maintaining one chamber component at an elevated temperature with another chamber component at a lower temperature, the inventors have observed an increase in processing chamber contamination from outside of the chamber when the sealing member comprises elastomer seals used with conventional sealing schemes.

Hence, another aspect of the present invention is to physically separate the process space from the transfer space of the processing chamber during processing, and thereby maintain the process space surfaces at a relatively high temperature to reduce film precursor accumulation, while maintaining transfer space surfaces at a lower temperature to reduce contamination within the transfer space region. Additionally, another aspect of the invention is to force whatever contaminants that do enter the process space into areas away from the substrate.

Figure 1B:
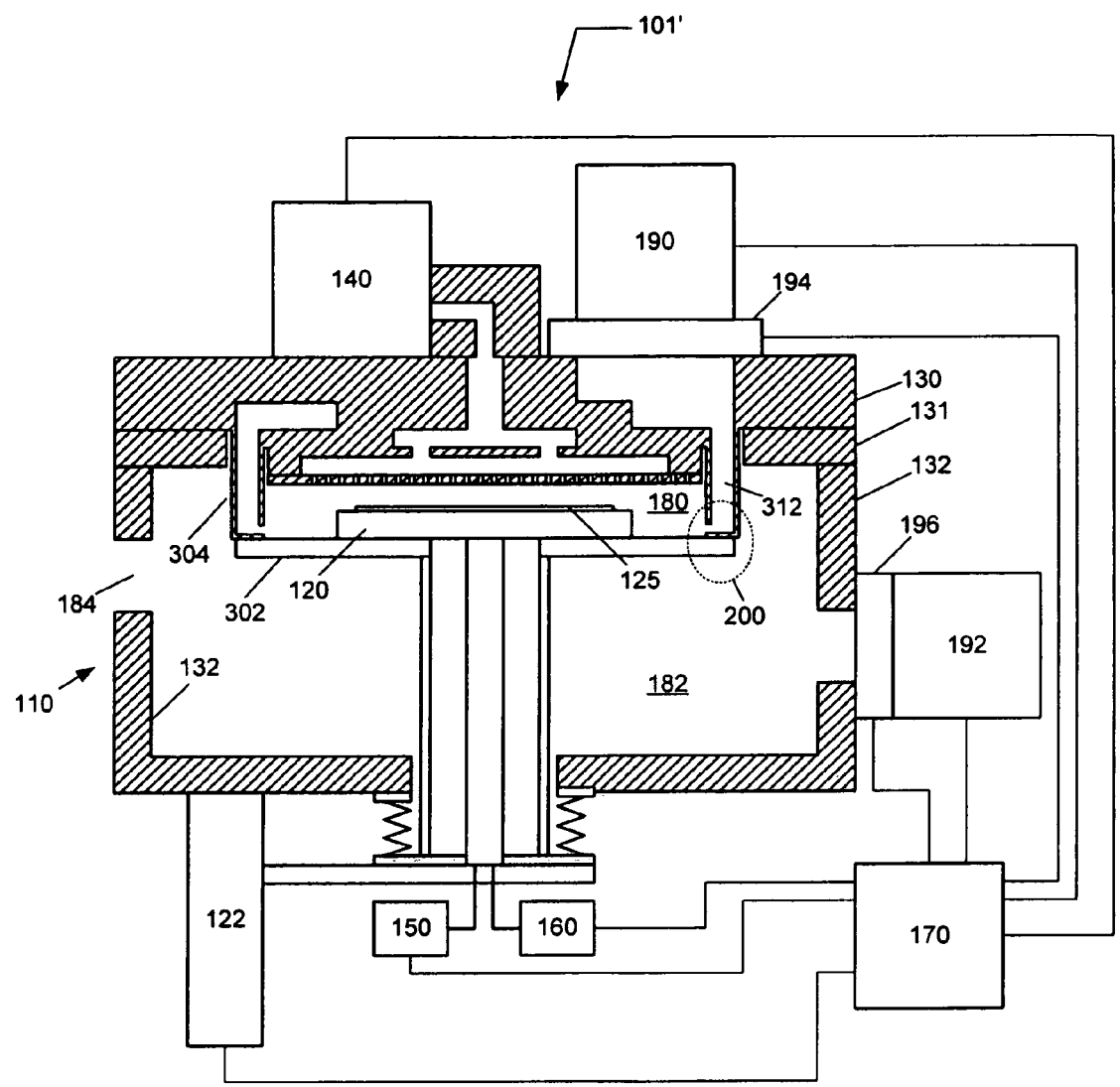

As shown in FIG. 1A, in one embodiment of the present invention, the deposition system 101 includes a processing chamber 110 having a substrate stage 120 configured to support a substrate 125, upon which a material deposit such as a thin film is formed. The processing chamber 110 further includes an upper chamber assembly 130 configured to define a process space 180 when coupled with substrate stage 120, and a lower chamber assembly 132 configured to define a transfer space 182. Optionally, as shown in FIG. 1B, an intermediate section 131 (i.e., a mid-chamber assembly) can be used in deposition system 101' to connect the upper chamber assembly 130 to the lower chamber assembly 132. Additionally, the deposition system 101 includes a process material supply system 140 configured to introduce a first process material, a second process material, or a purge gas to processing chamber 110. Additionally, the deposition system 101 includes a first power source 150 coupled to the processing chamber 110 and configured to generate plasma in the processing chamber 110, and a substrate temperature control system 160 coupled to substrate stage 120 and configured to elevate and control the temperature of substrate 125. Additionally, the deposition system 101 includes a process volume adjustment system 122 coupled to the processing chamber 110 and the substrate holder 120, and configured to adjust the volume of the process space 180 adjacent substrate 125. For example, the process volume adjustment system 180 can be configured to vertically translate the substrate holder 120 between a first position for processing substrate 125 (see FIGS. 1A and 1B) and a second position for transferring substrate 125 into and out of processing chamber 110 (see FIGS. 2A and 2B).

Furthermore, the deposition system 101 includes a first vacuum pump 190 coupled to process space 180, wherein a first vacuum valve 194 is utilized to control the pumping speed delivered to process space 180. The deposition system 101 includes a second vacuum pump 192 coupled to transfer space 182, wherein a second vacuum valve 196 is utilized to isolate the second vacuum pump 192 from transfer space 182, when necessary.

Further yet, deposition system 101 includes a controller 170 that can be coupled to processing chamber 110, substrate holder 120, upper assembly 130, lower assembly 132, process material supply system 140, first power source 150, substrate temperature control system 160, process volume adjustment system 122, first vacuum pump 190, first vacuum valve 194, second vacuum pump 192, and second vacuum valve 196.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to processing chamber 110, and may be lifted to and from an upper surface of substrate holder 120 via substrate lift system (not shown).

The process material supply system 140 can include a first process material supply system and a second process material supply system which are configured to alternatingly introduce a first process material to processing chamber 110 and a second process material to processing chamber 110. The alternation of the introduction of the first process material and the introduction of the second process material can be cyclical, or it may be acyclical with variable time periods between introduction of the first and second process materials. The first process material can, for example, include a film precursor, such as a composition having the principal atomic or molecular species found in the film formed on substrate 125. For instance, the film precursor can originate as a solid phase, a liquid phase, or a gaseous phase, and may be delivered to processing chamber 110 in a gaseous phase. The second process material can, for example, include a reducing agent. For instance, the reducing agent can originate as a solid phase, a liquid phase, or a gaseous phase, and it may be delivered to processing chamber 110 in a gaseous phase. Examples of gaseous film precursors and reduction gases are given below.

Additionally, the process material supply system 140 can further include a purge gas supply system that can be configured to introduce a purge gas to processing chamber 110 between introduction of the first process material and the second process material to processing chamber 110, respectively. The purge gas can include an inert gas, such as a noble gas (i.e., helium, neon, argon, xenon, krypton), or nitrogen (and nitrogen containing gases), or hydrogen (and hydrogen containing gases).

Figure 2A:
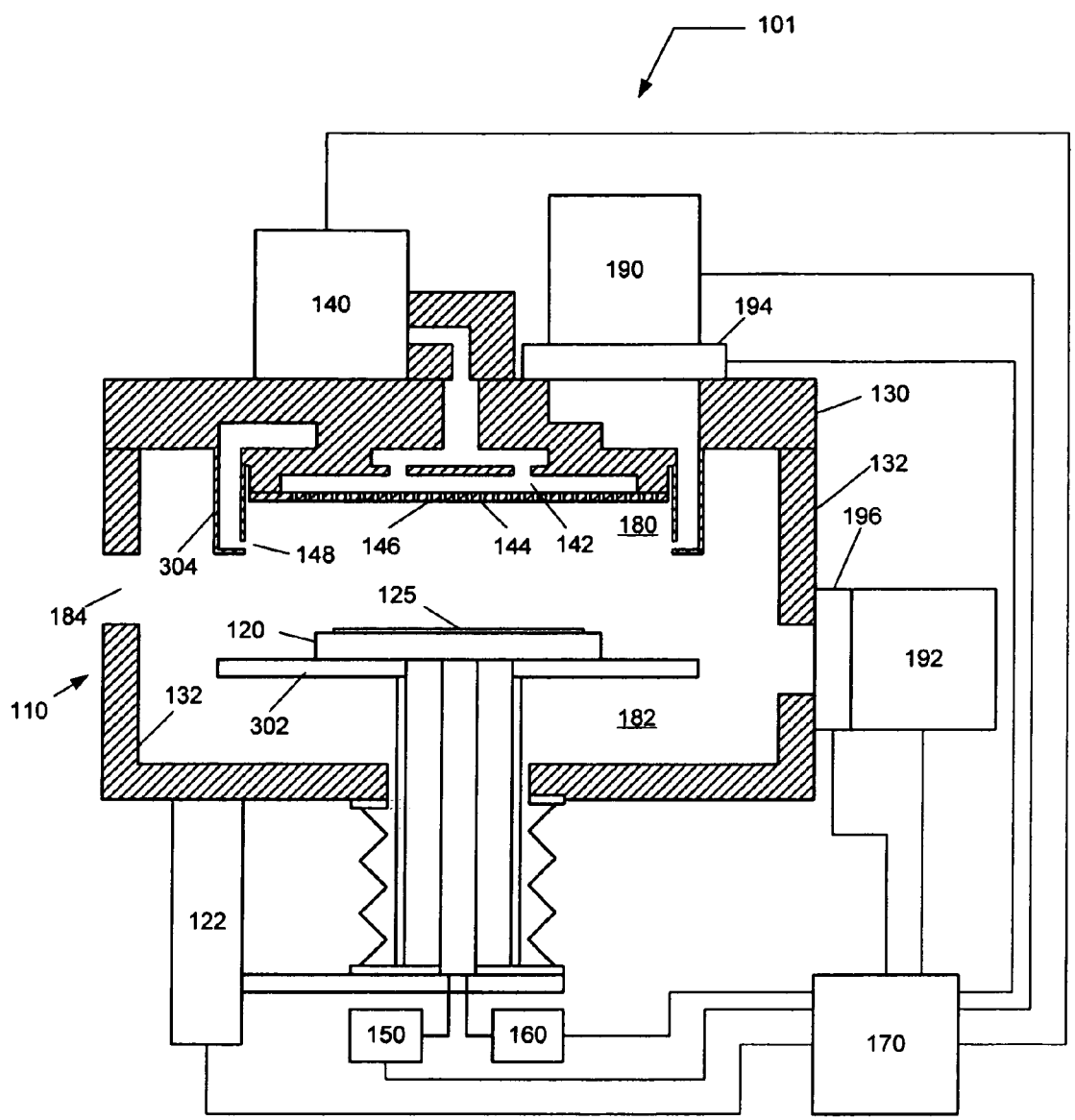
FIG. 2 depicts a schematic view of the deposition system of FIG. 1 in accordance with one embodiment of the present invention in which sample transfer is facilitated at a lower sample stage position.
Figure 2B:
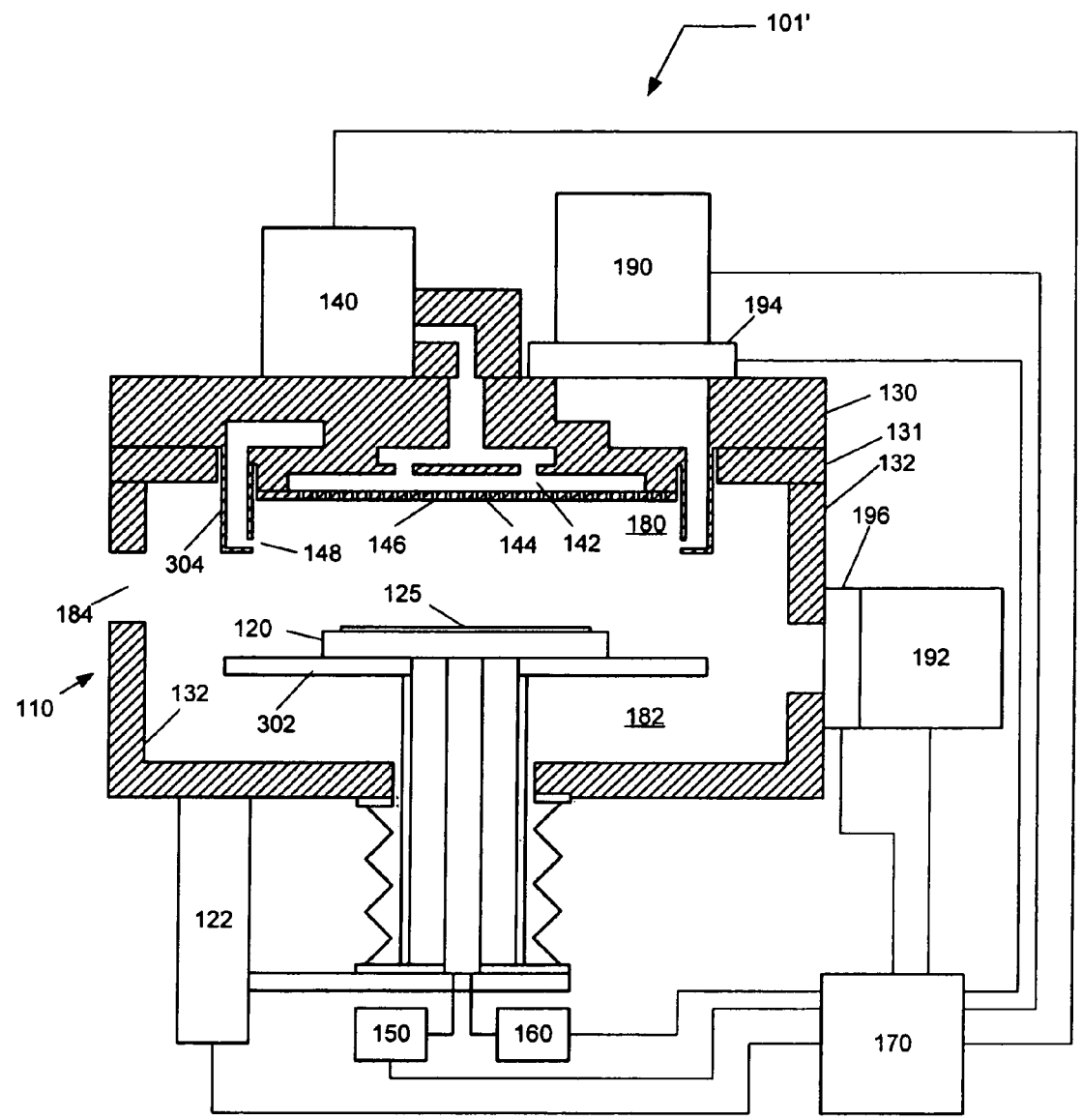

The process gas supply system 140 can include one or more material sources, one or more pressure control devices, one or more flow control devices, one or more filters, one or more valves, or one or more flow sensors. As shown in FIG. 2A, the process gas supply system 140 can supply one or more process gases to plenum 142, through which gases are dispersed to a plurality of orifices 146 in injection plate 144. The plurality of orifices 146 in injection plate 144 facilitates the distribution of process gases within process space 180. A showerhead design, as known in the art, can be used to uniformly distribute the first and second process gas materials into the process space 180. Exemplary showerheads are described in greater detail in pending U.S. Patent Application Pub. No. 20040123803, U.S. Ser. No. 10/469592 the entire contents of which is incorporated herein by reference in its entirety, and in previously incorporated by reference U.S. Ser. No. 11/090,255.

Referring back to FIG. 1A, deposition system 101 can be configured to perform a thermal deposition process (i.e., a deposition process not utilizing a plasma), such as a thermal atomic layer deposition (ALD) process or a thermal chemical vapor deposition (CVD) process. Alternatively, deposition system 101 can be configured for a plasma enhanced deposition process in which either of the first process material or the second process material can be plasma activated. The plasma enhanced deposition process can include a plasma enhanced ALD (PEALD) process, or it may include a plasma enhanced CVD (PECVD) process.

In a PEALD process, a first process material, such as a film precursor, and a second process material, such as a reduction gas, are sequentially and alternatingly introduced to form a thin film on a substrate. For example, when preparing a tantalum-containing film using a PEALD process, the film precursor can comprise a metal halide (e.g., tantalum pentachloride), or a metal organic (e.g., $Ta(NC(CH_3)_2C_2H_5)(N(CH_3)_2)_3$; hereinafter referred to as TAIMATA0®; for additional details, see U.S. Pat. No. 6,593,484). In this example, the reduction gas can include hydrogen, ammonia ($NH_3$), $N_2$ and $H_2$, $N_2H_4$, $NH(CH_3)_2$, or $N_2H_3CH_3$, or any combination thereof.

The film precursor is introduced to processing chamber 110 for a first period of time in order to cause adsorption of the film precursor on exposed surfaces of substrate 125. Preferably, a monolayer adsorption of material occurs. Thereafter, the processing chamber 110 is purged with a purge gas for a second period of time. After adsorbing film precursor on substrate 125, a reduction gas is introduced to processing chamber 110 for a third period of time, while power is coupled through, for example, the upper assembly 130 from the first power source 150 to the reduction gas. The coupling of power to the reduction gas heats the reduction gas, thus causing ionization and dissociation of the reducing gas in order to form, for example, dissociated species such as atomic hydrogen which can react with the adsorbed Ta film precursor to reduce the adsorbed Ta film precursor to form the desired Ta containing film. This cycle can be repeated until a Ta containing layer of sufficient thickness is produced.

Further, the second process material can be introduced concurrent with or immediately about the time in which the process space 180 is increased in volume from V1 to V2. Power can be coupled through the substrate stage 120 from the first power source 150 to the second process material. The coupling of power to the second process material heats the second process material, thus causing ionization and dissociation of the second process material (i.e., plasma formation) in order to reduce the adsorbed constituents of the first process material. The processing chamber can be purged with a purge gas for another period of time. The introduction of the first process gas material, the introduction of the second process material, and the formation of the plasma while the second process material is present can be repeated any number of times to produce a film of desired thickness.

Moreover, first volume (V1) can be sufficiently small such that the first process gas material passes through the process space and some fraction of the first process material adsorbs on the surface of the substrate. As the first volume of the process space is reduced, the amount of the first process material necessary for adsorption on the substrate surface is reduced and the time required to exchange the first process material within the first process space is reduced. For instance, as the first volume of the process space is reduced, the residence time is reduced, hence, permitting a reduction in the first period of time.

As shown in FIG. 1, the process space 180 is separated from the transfer space 182 by the substrate stage 120, a flange 302 on the substrate stage 120, and an extension 304 from the upper chamber assembly 130. As such, there can be a sealing mechanism at the base of the extension 304 to seal or at least impede gas flow between the process space and the transfer space (to be discussed in detail later). Thus, surfaces of the process space 180 can be maintained at an elevated temperature to prevent accumulation of process residues on surfaces surrounding that space, while surfaces of the transfer space can be maintained at a reduced temperature to reduce contamination of the lower assembly 132 (including sidewalls) and the intermediate section 131 and the upper assembly 132.

In this regard separation of the process space from the transfer space, in one embodiment of the present invention, involves thermal separation of the elevated upper chamber assembly 130 from the reduced temperature lower chamber assembly 132. For thermal separation, the extension 304 can function as a radiation shield. Moreover, the extension 304 including an annular volume 312 can function as a thermal impedance limiting the heat flow across the extension element into the transfer space 182 surrounding the extension 304.

In another example of thermal separation, a cooling channel can be provided in the upper chamber assembly 130 near the lower chamber assembly 132 as shown in FIG. 1A, or near the intermediate section 131 as shown in FIG. 1B, or can be provided in the intermediate section 131. Further, the thermal conductivity of the materials for the upper chamber assembly 130 and the intermediate section 131 can be different. For example, the upper chamber assembly 130 can be made of aluminum or an aluminum alloy, and the intermediate section 131 can be made of stainless steel. The lower chamber assembly 132 can be made of aluminum or an aluminum alloy.

In one example, a vapor deposition process can be used be to deposit tantalum (Ta), tantalum carbide, tantalum nitride, or tantalum carbonitride in which a Ta film precursor such as $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3)$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, adsorbs to the surface of the substrate followed by exposure to a reduction gas or plasma such as $H_2$, $NH_3$, $N_2$ and $H_2$, $N_2H_4$, $NH(CH_3)_2$, or $N_2H_3CH_3$.

In another example, titanium (Ti), titanium nitride, or titanium carbonitride can be deposited using a Ti precursor such as $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT), and a reduction gas or plasma including $H_2$, $NH_3$, $N_2$ and $H_2$, $N_2H_4$, $NH(CH_3)_2$, or $N_2H_3CH_3$.

As another example, tungsten (W), tungsten nitride, or tungsten carbonitride can be deposited using a W precursor such as $WF_6$, or $W(CO)_6$, and a reduction gas or plasma including $H_2$, $NH_3$, $N_2$ and $H_2$, $N_2H_4$, $NH(CH_3)_2$, or $N_2H_3CH_3$.

In another example, molybdenum (Mo) can be deposited using a Mo precursor such as molybdenum hexafluoride ($MoF_6$), and a reduction gas or plasma including $H_2$.

In another example, Cu can be deposited using a Cu precursor having Cu-containing organometallic compounds, such as Cu(TMVS)(hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The reduction gas or plasma can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example of a vapor deposition process, when depositing zirconium oxide, the Zr precursor can include $Zr(NO_3)_4$, or $ZrCl_4$, and the reduction gas can include $H_2O$.

When depositing hafnium oxide, the Hf precursor can include $Hf(OBu^t)_4$, $Hf(NO_3)_4$, or $HfCl_4$, and the reduction gas can include $H_2O$. In another example, when depositing hafnium (Hf), the Hf precursor can include $HfCl_4$, and the second process material can include $H_2$.

When depositing niobium (Nb), the Nb precursor can include niobium pentachloride ($NbCl_5$), and the reduction gas can include $H_2$.

When depositing zinc (Zn), the Zn precursor can include zinc dichloride ($ZnCl_2$), and the reduction gas can include $H_2$.

When depositing silicon oxide, the Si precursor can include $Si(OC_2H_5)_4$, $SiH_2Cl_2$, $SiCl_4$, or $Si(NO_3)_4$, and the reduction gas can include $H_2O$ or $O_2$. In another example, when depositing silicon nitride, the Si precursor can include $SiCl_4$, or $SiH_2Cl_2$, and the reduction gas can include $NH_3$, or $N_2$ and $H_2$. In another example, when depositing TiN, the Ti precursor can include titanium nitrate ($Ti(NO_3)$), and the reduction gas can include $NH_3$.

In another example of a vapor deposition process, when depositing aluminum, the Al precursor can include aluminum chloride ($Al_2Cl_6$), or trimethylaluminum ($Al(CH_3)_3$), and the reduction gas can include $H_2$. When depositing aluminum nitride, the Al precursor can include aluminum trichloride, or trimethylaluminum, and the reduction gas can include $NH_3$, or $N_2$ and $H_2$. In another example, when depositing aluminum oxide, the Al precursor can include aluminum chloride, or trimethylaluminum, and the reduction gas can include $H_2O$, or $O_2$ and $H_2$.

In another example of a vapor deposition process, when depositing GaN, the Ga precursor can include gallium nitrate $(Ga(NO_3)_3)$, or trimethylgallium $(Ga(CH_3)_3)$, and the reduction gas can include $NH_3$.

In the examples given above for forming various material layers, the process material deposited can include at least one of a metal film, a metal nitride film, a metal carbonitride film, a metal oxide film, or a metal silicate film. For example, the process material deposited can include at least one of a tantalum film, a tantalum nitride film, or a tantalum carbonitride film. Alternatively, for example, the process material deposited can include for example an Al film, or a Cu film deposited to metallize a via for connecting one metal line to another metal line or for connecting a metal line to source/drain contacts of a semiconductor device. The Al or Cu films can be formed with or without a plasma process using precursors for the Al and Cu as described above. Alternatively, for example, the process material deposited can include a zirconium oxide film, a hafnium oxide film, a hafnium silicate film, a silicon oxide film, a silicon nitride film, a titanium nitride film, and/or a GaN film deposited to form an insulating layer such as for example above for a metal line or a gate structure of a semiconductor device.

Further, silane and disilane could be used as silicon precursors for the deposition of silicon-based or silicon-including films. Germane could be used a germanium precursor for the deposition of germanium-based or germanium-including films. As such, the process material deposited can include a metal silicide film and/or a germanium-including film deposited for example to form a conductive gate structure for a semiconductor device.

Referring still to FIG. 1A, the deposition system 101 includes a plasma generation system configured to generate a plasma during at least a portion of the alternating introduction of the first process material and the second process material to processing chamber 110. The plasma generation system can include the first power source 150 coupled to the processing chamber 110, and configured to couple power to the first process material, or the second process material, or both in processing chamber 110. The first power source 150 may include a radio frequency (RF) generator and an impedance match network (not shown), and may further include an electrode (not shown) through which RF power is coupled to plasma in processing chamber 110. The electrode can be formed in the substrate stage 120, or may be formed in the upper assembly 130 and can be configured to oppose the substrate stage 120. The substrate stage 120 can be electrically biased with a DC voltage or at an RF voltage via the transmission of RF power from an RF generator (not shown) through an impedance match network (not shown) to substrate stage 120.

The impedance match network can be configured to optimize the transfer of RF power from the RF generator to the plasma by matching the output impedance of the match network with the input impedance of the processing chamber, including the electrode, and plasma. For instance, the impedance match network serves to improve the transfer of RF power to plasma in plasma processing chamber 110 by reducing the reflected power. Match network topologies (e.g. L-type, π-type, T-type, etc.) and automatic control methods are well known to those skilled in the art. A typical frequency for the RF power can range from about 0.1 MHz to about 100 MHz. Alternatively, the RF frequency can, for example, range from approximately 400 kHz to approximately 60 MHz, By way of further example, the RF frequency can, for example, be approximately 13.56 or 27.12 MHz.

Still referring to FIG. 1A, deposition system 101 includes substrate temperature control system 160 coupled to the substrate stage 120 and configured to elevate and control the temperature of substrate 125. Substrate temperature control system 160 includes temperature control elements, such as a cooling system including a re-circulating coolant flow that receives heat from substrate stage 120 and transfers heat to a heat exchanger system (not shown), or when heating, transfers heat from the heat exchanger system. Additionally, the temperature control elements can include heating/cooling elements, such as resistive heating elements, or thermo-electric heaters/coolers can be included in the substrate holder 120, as well as the chamber wall of the processing chamber 110 and any other component within the deposition system 101.

In order to improve the thermal transfer between substrate 125 and substrate stage 120, substrate stage 120 can include a mechanical clamping system, or an electrical clamping system, such as an electrostatic clamping system, to affix substrate 125 to an upper surface of substrate stage 120. Furthermore, substrate holder 120 can further include a substrate backside gas delivery system configured to introduce gas to the backside of substrate 125 in order to improve the gas-gap thermal conductance between substrate 125 and substrate stage 120. Such a system can be utilized when temperature control of the substrate is required at elevated or reduced temperatures. For example, the substrate backside gas system can include a two-zone gas distribution system, wherein the helium gas gap pressure can be independently varied between the center and the edge of substrate 125.

Furthermore, the processing chamber 110 is further coupled to the first vacuum pump 190 and the second vacuum pump 192. The first vacuum pump 190 can include a turbo-molecular pump, and the second vacuum pump 192 can include a cryogenic pump.

The first vacuum pump 190 can include a turbo-molecular vacuum pump (TMP) capable of a pumping speed up to about 5000 liters per second (and greater) and valve 194 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass.).

As shown in FIGS. 1A, 1B, 2A and 2B, the first vacuum pump 190 can be coupled to process space 180 such that it is located above the plane of substrate 125. The present inventors have recognized that conventionally it has been undesirable to locate a vacuum pump on top of the process chamber because this generally requires the pump inlet to be located above a level of the substrate. Thus, particles accumulating at the inlet can be released during processing and settle on the substrate as contamination. The inventors have further recognized, however, that separating the processing space from the transfer space and providing separate pumping of these areas as described above makes it preferable to locate the processing space pump above a level of the substrate for space considerations, for example. That is, the first vacuum pump 190 can be configured to access process space 180 such that it pumps process space 180 from a location below the plane of substrate 125 in order to, for example, reduce particle contamination. The fluid coupling (fluid communication) between the location of pumping from process space 180 and the inlet to the first vacuum pump 190 can be designed for maximal flow conductance. Alternately, the fluid coupling between the location of pumping from process space 180 and the inlet to the first vacuum pump 190 can be designed for a substantially constant cross-sectional area. In any case, it is often preferable to evacuate the process space 180 uniformly so that all areas of the substrate experience similar process conditions.

In one embodiment, the first vacuum pump 190 is located above the upper chamber assembly 130 and is physically coupled to an upper surface thereof (see FIG. 1A). The inlet 191 of the first vacuum pump 190 is coupled to at least one annular volume, such as a first annular volume 352 coupled to second annular volume 312, which in turn is coupled through extension 304 to one or more openings 305 that access process space 180 at a location below the plane of substrate 125. Typically, the one or more openings 305 are merely "below" the plane of the substrate 125, but not directly below the substrate 125 itself. However, it is possible to arrange the one or more openings 305 at other locations within the process space 180. The one or more openings 305 may comprise a continuous annular opening, one or more slots, one or more orifices, or any combination thereof. Typically, the first vacuum pump 190 is physically coupled to the upper chamber assembly 130 via the first vacuum valve 194. However, intermediate connections may be used such that the first vacuum pump is not actually supported by the upper chamber assembly.

As noted above, it may be more convenient to locate the first vacuum pump 190 above the process space 180 than below the process space 180. In addition to space considerations, this may be due, for example, to the presence of the transfer space 182 and the process of translating the substrate stage 120 back and forth from the first and second position. Thus, a connection must be made to allow fluid communication between the first pump 190, located above the process space 180 (and therefore above the substrate 125) and the one or more openings 305 which are preferably located below the substrate 125.

The inlet 191 of the first vacuum pump 190 is in fluid communication with a first annular volume 352 that is in turn in fluid communication with a second annular volume 312, whereby the first annular volume and the second annular volume are coupled or placed in fluid communication via one or more pumping ports 354. The second annular volume is typically coupled through extension 304 to one or more openings 305 that access process space 180 at a location below the plane of substrate 125.

As discussed above, locating the one or more openings 305 below the level of the substrate 125 can impede particle accumulation released from the pump inlet 191 from reaching the substrate surface. Further, positioning the openings 305 below the substrate can cause a result that the flow of gas within the process space 180 will generally be downward and away from the center of the substrate 125. Accordingly, any particulate accumulation will tend to occur beneath the level of the substrate 125 and will be less likely to contaminate the surface of the substrate 125. Thus, causing vacuum flow from beneath the substrate 125 can reduce contamination of the substrate 125.

In one example of the fluid connection between the first and second annular volumes, the one or more pumping ports 354 may comprise two through-holes diametrically opposing one another (i.e., 180 degrees apart as relates to a circle which has the center of the substrate stage 120 as its center). The pumping ports 354 allow gas to flow from the second annular volume 312 to the first annular volume 352. The number of pumping ports may be more or less, and their location may vary.

Additionally, for example, the one or more openings 305 may comprise two holes or slots diametrically opposing one another (i.e., 180 degrees apart). Furthermore, each slot can extend approximately 120 degrees in the azimuthal direction. However, the number of openings 305 may be more or less, and their location and size may vary. Preferably, as shown in FIGS. 1 and 2, the pumping ports 354 are offset in a vertical direction from the one or more openings 305 in order to alter the flow path from the one or more openings 305, thus providing more symmetric pumping from the process space 180.

As discussed above, one aspect of the present invention is to improve consistency of the process across the substrate 125 by evacuating the process space 180 uniformly so that all areas of the substrate 125 experience similar process conditions. If the first vacuum pump inlet 191 is not positioned directly above or below the center of the substrate 125, inconsistent flow during pumping may arise. This is particularly true where pumping of the process space occurs through a limited volume opening 305 that is confined below the substrate. Accordingly, measures should be taken in order to compensate for any bias in flow created by positioning the first vacuum pump inlet 191 off-center to the substrate 125.

Figure 8A:
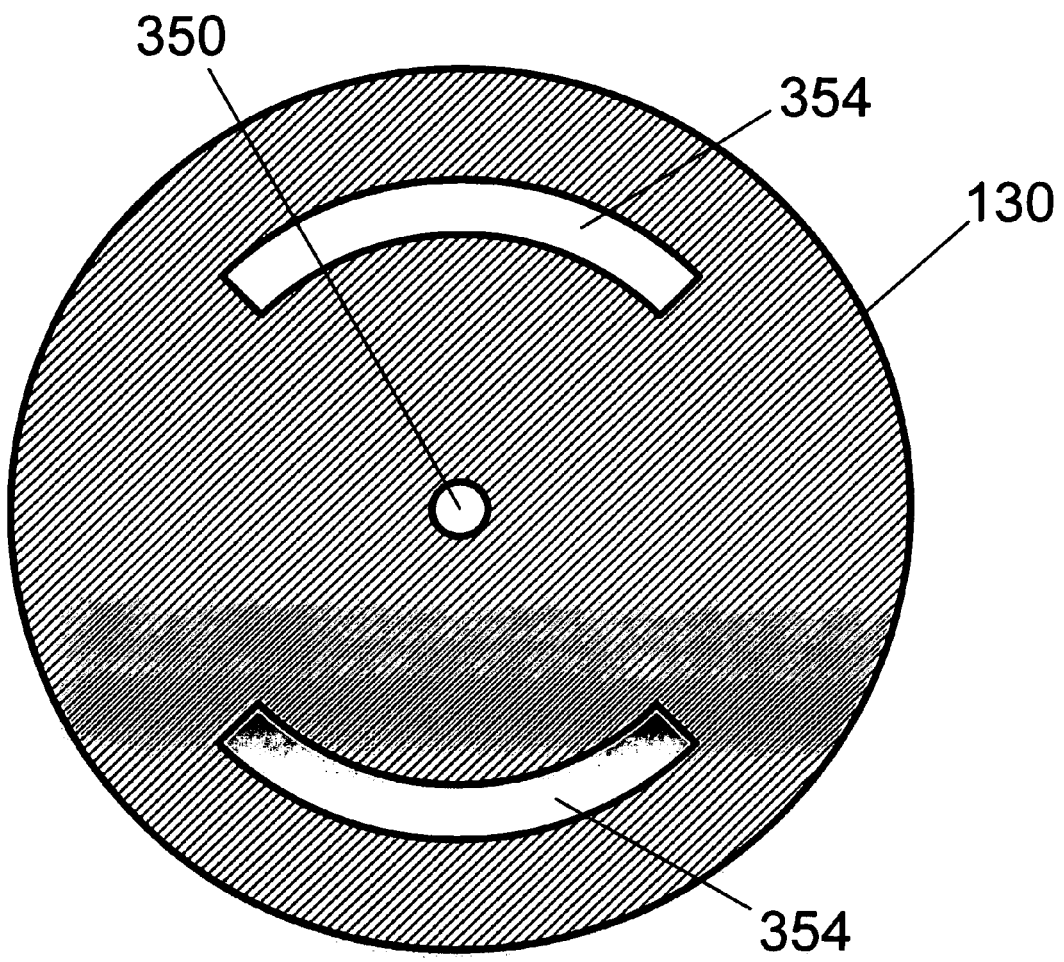
FIG. 8A shows a cross-section of the upper chamber assembly.

FIG. 8A shows a cross section of the upper chamber assembly 130 of FIG. 1A. In the center of the upper chamber assembly 130 is a process gas supply port 350 through which process gas may be supplied to the plenum 142. Also shown are pumping ports 354 which allow fluid communication between a second annular volume 312 (shown in FIG. 8B) formed by the extension 304 and the first annular volume 352. Accordingly, the path taken by gas pumped from the process space 180 will enter the one or more openings 305, travel through the second annular volume 312 and then through the pumping ports 354. In one non-limiting embodiment, the pumping ports are not directly above the openings 305, and the gas is forced to change direction before passing through the pumping ports 354. However, depending on the size and shape of the openings 305 and the pumping ports 354, some overlap in the vertical direction may occur as shown in the cross-sections of FIGS. 1 and 2. After passing through the pumping ports 354, the gas will enter a first annular volume 352 which is in fluid communication with the inlet 191 of the first vacuum pump 190.

Figure 8B:
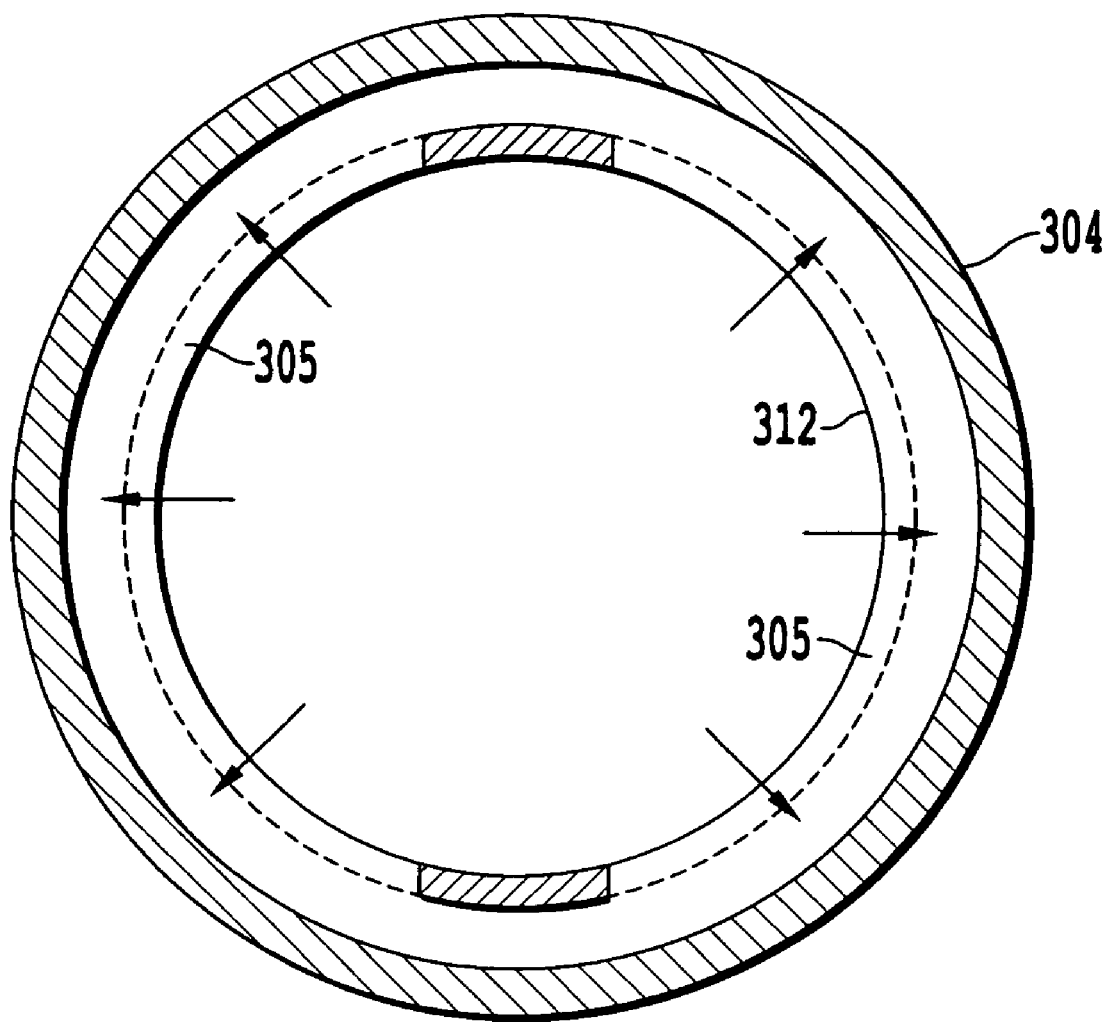
FIG. 8B shows a cross-section of the upper chamber assembly taken beneath the cross-section of FIG. 8A.
Figure 8C:
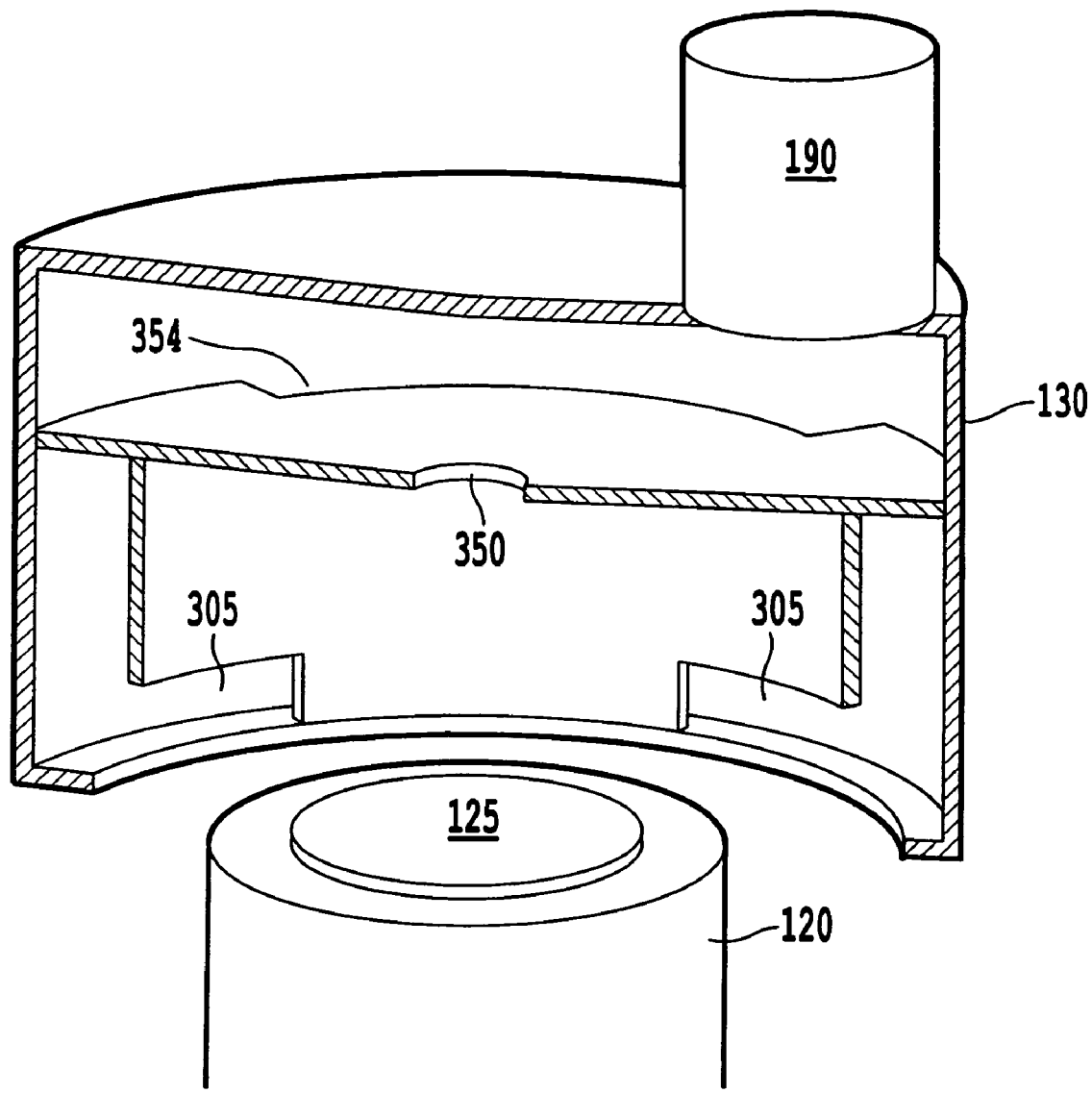
FIG. 8C shows a perspective cross-sectional view of the upper chamber assembly.

FIG. 8C shows a perspective cut-away view of one half of the upper chamber assembly, first annular volume 352, second annular volume 312, openings 305 and pumping ports 354. In this non-limiting embodiment, the openings 305 will each extend over an arc of approximately 30° on two sides of the processing space 180. However, other sizes of openings 305 are possible. Similarly, the shown pumping port 354 extends over an arc of approximately 90° as shown in FIG. 8B, but other sizes and shapes are possible. Typically, the pumping port 354 will have a mirrored counterpart on the opposite side of the chamber.

By selectively sizing, shaping, and positioning the openings 305, the pumping ports 354 and/or the first annular volume 352, the path and volume of gas pumped from the process space 180 can be controlled. Preferably, the system is designed to achieve maximum pump conductance while also maintaining uniform pumping conditions. For example, the combined area of the openings 305 and the pumping ports 354 can be sized to match or exceed the opening area of the first pump inlet 191. Additionally, the conductance of the pumping ports can be sized and shaped to maximize conductance from the second annular volume 312 to the first annular volume 352. Further, the location of the pumping ports can be such that the gas pumped from the process space 180 encounters symmetrical conductances no matter which opening 305 it flows through, similar to the effect of placing the first vacuum pump inlet 191 directly over the center of the substrate 125. In other words, by altering the fluid pathway between the one or more openings 305 and the first pump inlet 191, gas flow during pumping can be made symmetric despite the off-center position of the first pump inlet 191.

In one non-limiting embodiment, the flow distance (the distance a gas must travel) between the one opening 305 and the first pump inlet 191 and the distance between another opening 305 and the first pump inlet are equal. In another non-limiting embodiment, the flow distances are not equal, but, due to the shape and size of the cross-section of the annular volumes 312 and 352, the conductances are equal.

In one non-limiting embodiment, the first pump inlet 191 is positioned at the 0° point as viewed from the top of the process space with the center of the substrate stage 120 defining the center of a circle with undetermined diameter. Thus, unless measures are taken to counteract the effect of the 0° location of the pump inlet, gas in the process space 180 will more readily be pumped from the 0° area of the chamber than the 180° area, thus degrading process uniformity. However, by having first and second annular volumes connected only by selectively positioned pumping ports 354, the pumping effect can be made more symmetrical.

In one exemplary embodiment, two pumping ports 354 are included. One of the pumping ports 354 is positioned at the 90° point on the above-described circle while the other pumping port 354 is positioned at the 270° point. In this arrangement, gas pumped from the process space at the 180° point must travel approximately the same distance to the first pump inlet 191 as does gas pumped from the 0° point. Thus, by forcing some gas pumped from the process space 180 to travel a longer route to the pump inlet 191 than it would if a direct connection were made, better process uniformity can be achieved.

In one exemplary embodiment, pumping ports 354 are located at the 0° and 180° points on the above-described circle. In another exemplary embodiment, more than two pumping ports 354 are included around the periphery of the process space 180. Preferably, the pumping ports 354 are positioned symmetrically in the process space about a line defined by the center of the first pump inlet 191 and the center of the substrate stage 120. For example, if two pumping ports 354 are provided, and the first pump inlet is at the 0° point, each pumping port 354 has a counterpart opening 354 mirrored about the line defined by the center of the first pump inlet 191 and the center of the substrate stage 120. One such arrangement would be to have one pumping port 354 at each of the 90°0 and 270° points. Other arrangements with more pumping ports 354 in order to increase total conductance are contemplated, but with more openings, the less balanced the vacuum pumping becomes. To restore the balance of vacuum pumping from all sides of the process space, different sizes or shapes of pumping ports 354 may be used.

In one non-limiting example, again with the first pump inlet 191 in the 0° position, a small pumping port 354 is included at the 0° and a large pumping port 354 is included at the 180° position. Thus, to counteract the bias in pumping caused by the off-center location of the first pump inlet 191, different sizes of pumping ports 354 may be used. One benefit of differently sized pumping ports is that the overall size of the first annular space 352 may be reduced because it need only carry the gas flow of one pumping port 352 to the first vacuum pump inlet 191; the remainder of the gas flow travels straight up the small pumping port located at the 0° position and directly into the first vacuum pump inlet 191, also located at the 0° position. However, the arrangement with pumping ports 354 located at the 90° and 270° positions is easier to balance for symmetrical flow than is the arrangement where the ports are at the 0° and 180° positions.

Aside from adjusting the size of the pumping ports 354, conductance of the ports can be varied by adjusting the shape of the pumping ports. For example, a long thin slot will have a lower conductance than a perfect circle of the same surface area. Thus, in some situations it may be beneficial to further reduce the overall size of the first annular space by providing long, thin pumping ports 354 in an area near the first pump inlet 191 while providing circular, wedge-shaped or square pumping ports 354 in areas further from the first pump inlet 191. Of course, the shapes of the pumping ports 354 may vary from the above-noted geometries.

Thus, the above-described arrangement reduces contamination in the process space because the gas takes a path downward and away from the substrate 125. Further, the arrangement allows the first vacuum pump 190 to reside above the process space 180, out of the way of components such as the moving substrate stage 125. Additionally, by incorporating the first annular volume 352, the second annular volume 312, and strategically placed pumping ports 354, the pumping process can be made more uniform.

As noted above, it is desirable to be able to adjust the volume of process space 180 without losing a seal between the upper chamber assembly 130 and the lower chamber assembly 132. FIGS. 3, 4, 5, and 6 illustrate several embodiments for sealing (and movably sealing) the substrate stage 120 with the upper chamber assembly 130 when the deposition system 101 is in a processing configuration. As such, the system includes a sealing member that impedes the flow of gas between the process space and the transfer space. Indeed, in one embodiment, a seal of the sealing member separates the vacuum environment of the process space from the vacuum environment of the transfer space. By vacuum separating the process space from the transfer space, the seal is able to reduce leakage between the process space and the transfer space to less than 10-3 Torr-l/s and preferably less than 10-4 Torr-l/s.

Figure 3:
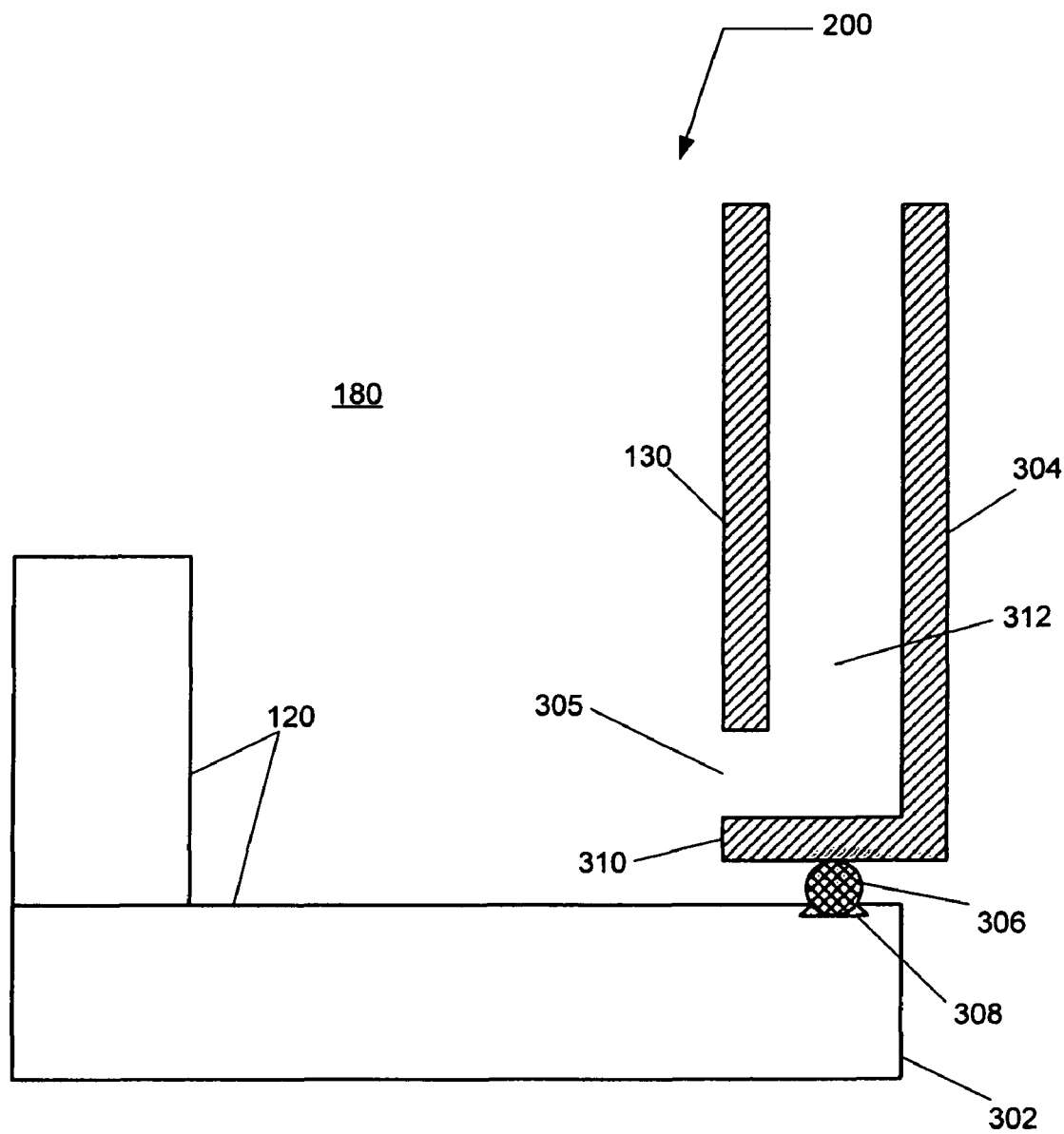
FIG. 3 depicts a schematic view of a sealing mechanism in accordance with one embodiment of the invention.

FIG. 3 is a schematic diagram illustrating a seal configuration for producing a seal between a flange 302 of the substrate stage 120 and an extension 304 from the upper chamber assembly 130. As shown in FIG. 3, a seal 306 is located in a groove 308 of the flange 302 of the substrate stage 120. Details of the seal 306 will be described below. As illustrated in FIG. 3, the seal 306 contacts a bottom plate 310 (i.e., a seal plate) of the extension 304. A second annular volume 312 is provided in the extension 304 for the purpose of evacuating gases from processing region 180 to pump 190. The configuration shown in FIG. 3 provides an adequate seal but does not accommodate considerable vertical translation without loss of the seal. For instance, only vertical motion less than a distance comparable to approximately one half of the seal 306 thickness can be tolerated before the seal looses contact with the bottom plate 310.

Figure 4:
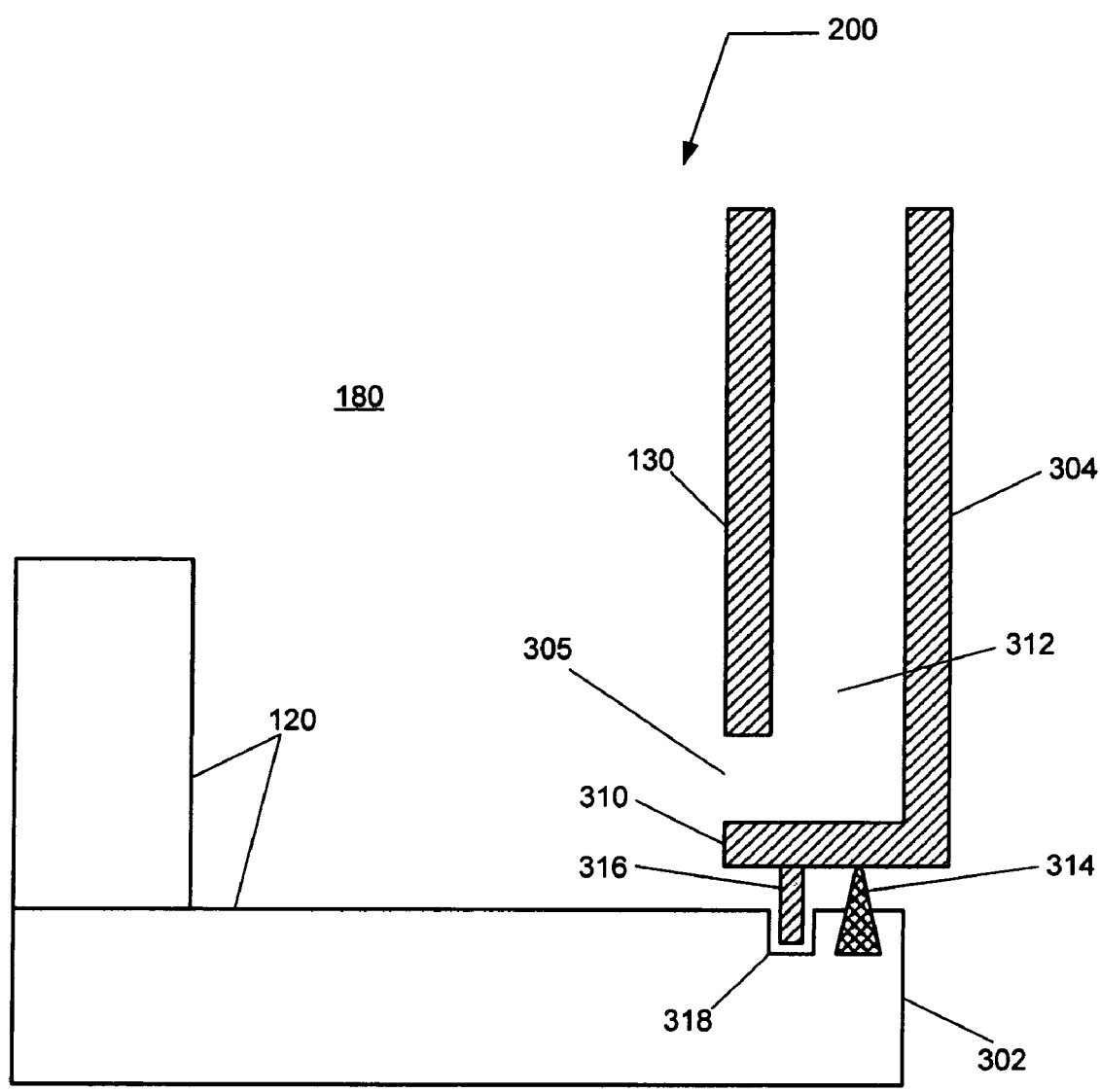
FIG. 4 depicts a schematic view of another sealing mechanism in accordance with one embodiment of the present invention.

In some applications, translations greater than that permitted in FIG. 3 are desirable. One such configuration is shown in FIG. 4. FIG. 4 is a schematic diagram illustrating a seal configuration for producing a seal between the flange 302 of the substrate stage 120 and the extension 304 from the upper chamber assembly 130. As shown in FIG. 4, the seal 314 is elongated in a vertical direction. In the embodiment of FIG. 4, the seal 314 has a triangular cross section, the apex of which contacts the bottom plate 310.

Further, in one embodiment of the present invention, the bottom plate 310 includes a protective guard 316 that extends toward the flange 302 so as to protect the seal 314 from inadvertent material deposits or exposure to plasma species such as the above-noted plasma generated reducing agents. To accommodate motion of the substrate stage 120 upwards to a point of contact with the tapered seal 314, a recess 318 is provided in the flange 302 of the substrate stage 120. As such, the configuration shown in FIG. 4 permits a greater translation than the seal configuration shown in FIG. 3. By utilization of the guard 316, the seal 316 can be protected and can be made less susceptible to material deposits or plasma deterioration.

Figure 5:
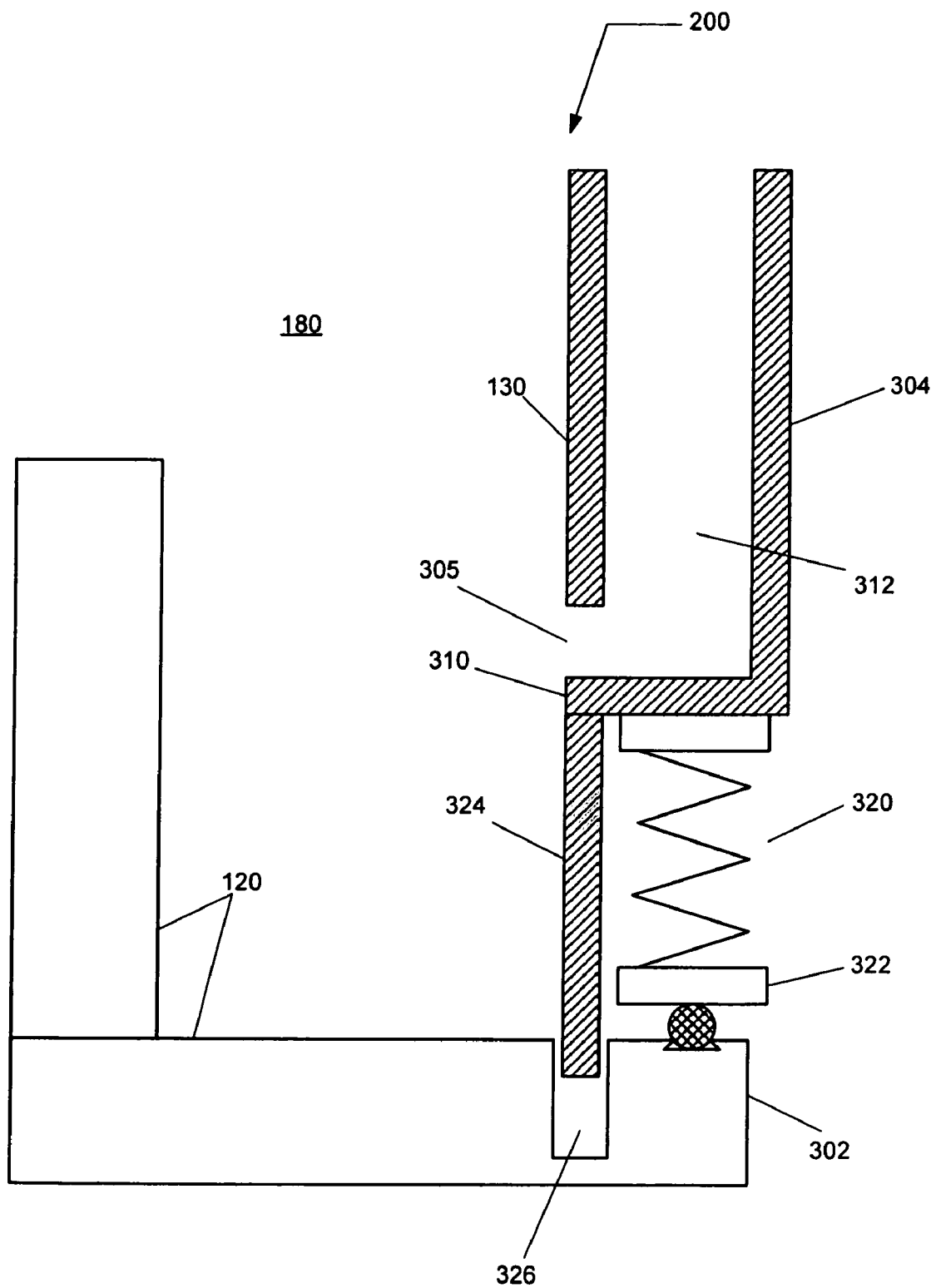
FIG. 5 depicts a schematic view of another sealing mechanism in accordance with one embodiment of the present invention.

FIG. 5 is a schematic diagram illustrating a seal configuration for producing a seal between the flange 302 of the substrate stage 120 and the extension 304 from the upper chamber assembly 130. The seal configuration depicted in FIG. 5 permits even greater translation of the substrate stage 120 in a vertical direction than the seal configurations shown in FIGS. 3 and 4. In one embodiment of the present invention, the bottom plate 310 connects to a bellows unit 320 which has a contact plate 322 (i.e., a seal plate).

In this configuration, the substrate stage 120 upon vertical translation via seal 306 contacts the contact plate 322 to make an initial seal. As the substrate stage 120 translates further vertically, the bellows unit 320 compresses permitting further vertical travel without loss of seal. As shown in FIG. 5, similar to the seal configuration of FIG. 4, a guard 324 can be provided in one embodiment of the present invention to protect the bellows unit 320 from inadvertent material deposits. The bellows unit 320 being a metallic material such as stainless steel will not be prone to deterioration from plasma exposure. Further, as in FIG. 4, a recess 326 can be provided in the flange 302 of the substrate stage 120. By utilization of the guard 324, the bellow unit 320 can be protected and can be made less susceptible to material deposits.

Figure 6:
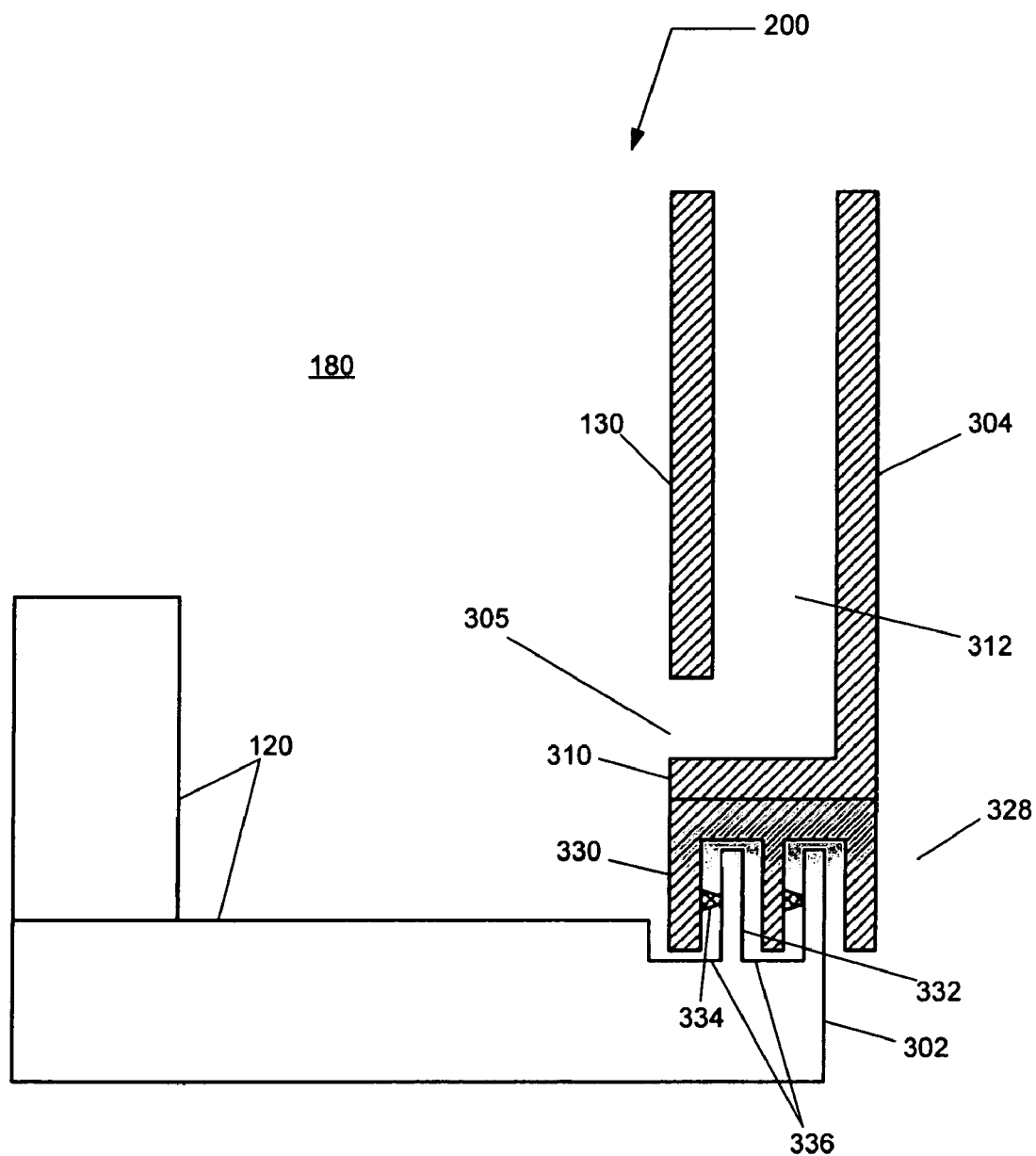
FIG. 6 depicts a schematic view of another sealing mechanism in accordance with one embodiment of the present invention.

FIG. 6 is a schematic diagram illustrating a seal configuration for producing a seal between the flange 302 of the substrate stage 120 and the extension 304 from the upper chamber assembly 130. The seal configuration depicted in FIG. 6 permits even greater translation of the substrate stage 120 than the seal configurations shown in FIGS. 3 and 4. In one embodiment of the present invention, the bottom plate 310 connects to a slider-unit 328. The slider unit 328 has at least one longitudinal plate 330 extending in a vertical direction that engages an associated reception plate 332 on the flange 302 of the substrate stage 120.

In one embodiment of the present invention, as shown in FIG. 6, there is a seal 334 disposed on a side wall of either the longitudinal plate 330 or the receptor plate 332 to provide for the seal. In one embodiment in the present invention, the receptor plate 332 is disposed in a recess 336 of the flange in order to protect the seal 334 from inadvertent material deposit or plasma deterioration. Further, the seal 334 can be a standard O-ring or preferably a tapered elastomer seal as shown in FIG. 6, in which the seal for example has a triangular cross section whose apex is at a point of seal between the flange 302 of the substrate stage 120 and the upper chamber assembly 130. The seal configuration depicted in FIG. 6 permits even greater translation of the substrate stage without loss of seal than the seal configurations shown in FIGS. 3 and 4. The longitudinal plate 330 provides protection of the seal 334 from material deposit or plasma deterioration.

In the seal configurations shown in FIGS. 4-6, for example, the second volume (V2) of the process space 180 can be set to a volume in which the formation of plasma from the second process material leads to the formation of uniform plasma above the substrate, without loss of seal between the process space 180 and the vacuum in the lower assembly 132. The ability according to the present invention to be able to provide a plasma process geometry of comparable uniformity to the process geometry permits the present invention to perform consecutive processes or process steps, i.e., non-plasma and plasma, in the same system without the need to transfer the substrate between different processing systems, thereby saving process time and reducing surface contamination at the interfaces between the process films, leading to improved material properties for the resultant films.

Figure 7:
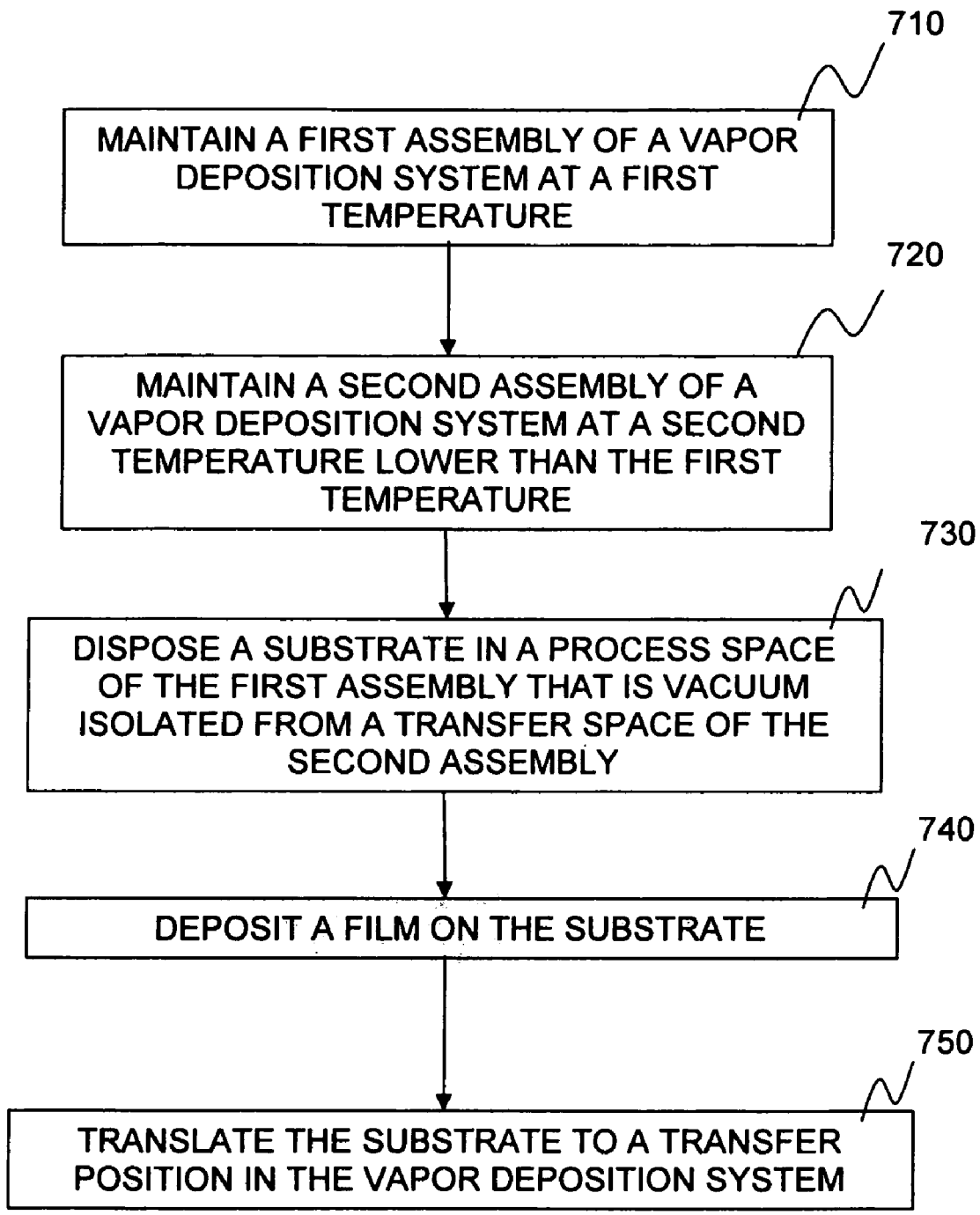
FIG. 7 shows a process flow diagram of a process in accordance with one embodiment of the present invention.

FIG. 7 shows a process flow diagram of a process in accordance with one embodiment of the present invention. The process of FIG. 7 may be performed by the processing system of FIGS. 1-2, or any other suitable processing system. As seen in FIG. 7, in step 710, the process includes disposing a substrate in a process space of a processing system that is vacuum isolated from a transfer space of the processing system. In step 720, a substrate is processed at either of a first position or a second position in the process space while maintaining vacuum isolation from the transfer space. In step 730, a material is deposited on the substrate at either the first position or the second position.

In steps 710-730, the first assembly can be maintained greater than or equal to 100 degrees C., while the second assembly can be maintained less than or equal to 100 degrees C. In steps 710-730, the first assembly can be maintained greater than or equal to 50 degrees C., while the second assembly can be maintained less than or equal to 50 degrees C. In steps 710-730, the gas conductance from the process space to the transfer space to less than $10^{-3}$ Torr-l/s, and preferably less than $10^{-4}$ Torr-l/s.

In step 730, in order to deposit a material, a process gas composition can be introduced to the process for vapor deposition of the material. Further, plasma can be formed from the process gas composition to enhance the vapor deposition rate.

In step 730, the material deposited can be at least one of a metal, metal oxide, metal nitride, metal carbonitride, or a metal silicide. For example, the material deposited can be at least one of a tantalum film, a tantalum nitride film, or a tantalum carbonitride film.

The processing system can be configured for at least one of an atomic layer deposition (ALD) process, a plasma enhanced ALD (PEALD) process, a chemical vapor deposition (CVD) process, or a plasma enhanced CVD (PECVD) process.

In step 730, plasma can be formed by applying radio frequency (RF) energy at a frequency from 0.1 to 100 MHz to a process gas in the process space. During step 730, an electrode can be connected to a RF power supply and configured to couple the RF energy into the process space. In one aspect of the present invention, prior to forming the plasma, the volume of the process space is increased in order to facilitate conditions more conducive for plasma uniformity. As such, prior to step 730, the substrate stage can be translated to a position that improves plasma uniformity of the vapor deposition process. For example, the substrate stage can be set to a position in which the plasma uniformity is better than 2% across a 200 mm diameter substrate or better than 1% across a 200 mm diameter substrate. Alternatively, for example, the substrate stage can be set to a position in which the plasma uniformity is better than 2% across a 300 mm diameter substrate or better than 1% across a 300 mm diameter substrate.

Furthermore, a purge gas can be introduced after depositing the material. Moreover, with or without the purge gas present, electromagnetic power can be coupled to the vapor deposition system to release contaminants from at least one of the vapor deposition system or the substrate. The electromagnetic power can be coupled into the vapor deposition system in the form of a plasma, an ultraviolet light, or a laser.

Referring to FIG. 1, controller 170 can include a microprocessor, memory, and a digital I/O port capable of generating control voltages sufficient to communicate and activate inputs to deposition system 101 as well as monitor outputs from deposition system 101. Moreover, the controller 170 may exchange information with the processing chamber 110, substrate stage 120, upper assembly 130, lower chamber assembly 132, process material supply system 140, first power source 150, substrate temperature control system 160, first vacuum pump 190, first vacuum valve 194, second vacuum pump 192, second vacuum valve 196, and process volume adjustment system 122. For example, a program stored in the memory may be utilized to activate the inputs to the aforementioned components of the deposition system 101 according to a process recipe in order to perform an etching process, or a deposition process.

The controller 170 can include a microprocessor, memory, and a digital I/O port capable of generating control voltages sufficient to communicate and activate inputs to deposition system 101 (101') as well as monitor outputs from deposition system 101 (101') in order to control and monitor the above-discussed processes for material deposition. For example, the controller 170 can include computer readable medium containing program instructions for execution to accomplish the steps described above in relation to FIG. 6. Moreover, the controller 170 may be coupled to and may exchange information with the process chamber 110, substrate stage 120, upper assembly 130, process material gas supply system 140, power source 150, substrate temperature controller 160, first vacuum pumping system 190, and/or second vacuum pumping system 192. For example, a program stored in the memory may be utilized to activate the inputs to the aforementioned components of the deposition system 101 (101') according to a process recipe in order to perform one of the above-described non-plasma or plasma enhanced deposition processes.

One example of the controller 170 is a DELL PRECISION WORKSTATION 610, available from Dell Corporation, Austin, Tex. However, the controller 170 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 170 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 170, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 170 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 170.

The controller 170 may be locally located relative to the deposition system 101 (101'), or it may be remotely located relative to the deposition system 101. For example, the controller 170 may exchange data with the deposition system 101 using at least one of a direct connection, an intranet, the Internet and a wireless connection. The controller 170 may be coupled to an intranet at, for example, a customer site (i.e., a device maker, etc.), or it may be coupled to an intranet at, for example, a vendor site (i.e., an equipment manufacturer). Additionally, for example, the controller 170 may be coupled to the Internet. Furthermore, another computer (i.e., controller, server, etc.) may access, for example, the controller 170 to exchange data via at least one of a direct connection, an intranet, and the Internet. As also would be appreciated by those skilled in the art, the controller 170 may exchange data with the deposition system 101 (101') via a wireless connection.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A deposition system configured to form a deposit on a substrate, comprising:
    a chamber assembly configured to facilitate material deposition and to facilitate transfer of said substrate into and out of said deposition system;

a substrate stage coupled to said chamber assembly and configured to support said substrate proximate a process space in said chamber assembly;

a vacuum pump in fluid communication with said chamber assembly and located above a level of said substrate; and a pumping manifold in fluid communication with an inlet of said vacuum pump and including at least one opening located below a level of said substrate, wherein said chamber assembly includes a first assembly including said process space configured to facilitate material deposition; and a second assembly coupled to said first assembly and including a transfer space to facilitate transfer of said substrate into and out of said deposition system, wherein said pumping manifold comprises an extension extending from the first assembly to separate the process space from the transfer space and in fluid communication with the at least one opening located below said substrate, wherein said pumping manifold includes a first annular volume pneumatically coupled to said inlet of said vacuum;

a second annular volume pneumatically coupled to said at least one opening located below said vacuum pump, and at least one pumping port pneumatically coupling said first annular volume to said second annular volume such that gas flows into the at least one opening located below the level of said vacuum pump, into the second annular volume, through the at least one pumping port, into the first volume, and then into said inlet of said vacuum pump, wherein the at least one pumping port includes a first pumping port and second pumping port, the first pumping port being located at a point 180° from the second pumping port in relation to a circle of which a center is a center of the substrate stage, wherein said extension includes an interior channel providing gas conductance from a first portion of the extension near the substrate stage to a second portion positioned longitudinally at an end of the extension opposite the first portion.

wherein said extension comprises a seal plate proximate the first portion of the extension, wherein the substrate stage comprises:

a flange configured to contact the seal plate of the extension upon a translation of the substrate stage toward the first assembly, wherein said flange includes said seal configured to seal against the seal plate.

wherein said seal comprises at least one of an 0-ring, a tapered elastomer, or a helical spring seal.

2. The deposition system of claim 1, wherein said internal channel comprises at least one annular volume coupling said one or more openings in said extension to said inlet of said vacuum pump.

3. The deposition system of claim 1, wherein the at least one pumping port is not vertically aligned with said vacuum pump.

4. The deposition system of claim 1, wherein the at least one pumping port is not vertically aligned with any of the at least one opening located below a level of said substrate.

5. The deposition system of claim 1, wherein said at least one opening comprises one or more slots.

6. The deposition system of claim 1, wherein said substrate stage is connected to said second assembly and configured to support and translate said substrate between a first position in said process space to a second position in said transfer space.

7. The deposition system of claim 6, further comprising:

a sealing assembly having a seal configured to impede gas flow between the process space and the transfer space during processing of the substrate within the process space.

8. The deposition system of claim 7, wherein said sealing assembly is configured to disengage the seal during a translation of the substrate from the first position to the second position in the transfer space.

9. The deposition system of claim 1, wherein said process space is configured for at least one of atomic layer deposition (ALD) or chemical vapor deposition (CVD).

10. The deposition system of claim 1, wherein the vacuum pump is disposed in a position offset from the center of the substrate stage as viewed from above.

11. The deposition system of claim 10, wherein the vacuum pump is disposed in a position of equal conductance to the first pumping port and the second pumping port.

* * * * *